United States Patent
Cava et al.

[11] Patent Number: 5,982,034
[45] Date of Patent: *Nov. 9, 1999

[54] CONDUCTIVE OXIDE FILMS

[75] Inventors: Robert Joseph Cava, Basking Ridge; Chang-Beom Eom, Scotch Plains, both of N.J.

[73] Assignee: Lucent Technologies Inc., Murray Hill, N.J.

[*] Notice: This patent issued on a continued prosecution application filed under 37 CFR 1.53(d), and is subject to the twenty year patent term provisions of 35 U.S.C. 154(a)(2).

[21] Appl. No.: 08/156,953

[22] Filed: Nov. 19, 1993

Related U.S. Application Data

[63] Continuation of application No. 07/940,426, Sep. 4, 1992, abandoned.

[51] Int. Cl.[6] ...................... H01L 23/48
[52] U.S. Cl. .................. 257/741; 257/295; 257/32
[58] Field of Search ............... 505/1, 700, 701, 505/702, 703, 741, 191, 192, 234, 236, 237, 238, 239; 204/290 F, 128; 257/30–36, 295, 741

[56] References Cited

U.S. PATENT DOCUMENTS

| | | | |
|---|---|---|---|
| 3,616,446 | 10/1971 | De Witt | 204/290 F |
| 3,711,397 | 1/1973 | Martinsons | 204/290 F |
| 3,990,957 | 11/1976 | Hoekje et al. | 204/128 |

OTHER PUBLICATIONS

Kidoh et al. "Ferroelectric Properties of Lead–Zirconate–Titanate Films Prepared by Laser Ablation", Appl. Phys. Lett., vol. 58, #25, Jun. 24, 1991 pp. 2910–2912.
Lichtenberg, F., et al, *Applied Physics Letters*, 60, 1138 (1992).
Eom, C.B., et al, *Applied Physics Letters*, 55, 595 (1989).
Eom, C.B., et al, *Physica C*, 171, 351 (1990).
Scott, J.F., et al, *Science*, 246, 1400 (1989).
Bondurant, D., et al, *IEEE Spectrum*, 26, 30 (1989).
Hashimoto, T., et al, *Applied Physics Letters*, 60, 1756 (1992).
Matthews, J.W., editor, *Epitaxial Growth*, Academic Press (1975).
Lee, M., et al, *Applied Physics Letters*, 57, 1152 (1990).
Chin, D.K., et al, *Applied Physics Letters*, 58, 753 (1991).
Pain, D.C., et al, editors, *Materials Research Society Symposium Proceedings*, 191, 1990.
Sawyer, C.B., et al, *Physical Review*, 35, 269 (1930).

*Primary Examiner*—Sara Crane

[57] ABSTRACT

Thin films of isotropically conductive material are formed from $Sr_{1-x}Ca_xRuO_3$. This material is easily deposited as a thin film by methods such as 90° off-axis sputtering and laser ablation. The materials are epitaxially deposited on a wide variety of substrates and allow overlying epitaxial growth of an equally large number of significant oxides such as superconducting oxides, dielectric, and ferroelectric materials.

8 Claims, 6 Drawing Sheets

$Ps = 10.5 \mu C/cm^2$
$Pr = 8.5 \mu C/cm^2$
$\begin{bmatrix} Ec = 70 \text{ KV/cm} \\ Vc = 3.2 \text{ V} \end{bmatrix}$

CONDUCTIVE OXIDE FILMS

This application is a continuation of application Ser. No. 07/940,426, filed on Sep. 4, 1992, now abandoned.

BACKGROUND OF THE INVENTION

1. Field of the Invention

This invention relates to devices containing epitaxial oxide thin films, and in particular, devices having electrically conductive oxides.

2. Art Background

Many electrical and optical devices rely on deposited thin oxide films. For example, thin films of superconducting oxides such as $YBa_2Cu_3O_7$ have been proposed for electronic devices such as SNS (superconductor-normal metal-superconductor) Josephson junctions and regions of normal metallic conductivity in an integrated superconducting device. Similarly, ferroelectric oxide materials such as $Pb(Zr_{0.52}Ti_{0.48})O_3$ (PZT) have been proposed for use in ferroelectric memory devices.

In forming thin film devices, a series of layers are deposited on a single crystal substrate. Typically, a thin film device has, in addition to the active region, (e.g. an optically, electrically, or magnetically active area) regions having dielectric properties and regions having relatively high electrical conductivity. (Relatively high electrical conductivity in the context of this invention is a resistivity less than 1000 $\mu\Omega$-cm.) The conductive regions are generally employed to form contact to and interconnections between active regions while the dielectric regions are required to provide electrical isolation between different conductive and/or active regions. As shown in FIG. 1 to produce electrical conductivity between active regions 12 and 14, it is necessary to have equally high conductivity throughout the conductive material forming interconnect region 15 and contact regions 10. Thus, for many electrically conductive regions such as contact regions, it is quite desirable or even necessary that the conductivity be isotropic, i.e., the conductivity along the z-axis (an axis perpendicular to the major surface of the thin film), as well as two other mutually perpendicular axes have a mean deviation of less than 300% over the operating temperature range.

The characteristics of the device, however, rely on more than just the chemical composition of the constituent layers. To obtain the desired properties such as electrical properties, these layers, (e.g., the oxide materials, such as the ferroelectric oxide material or the superconducting oxide material) must be epitaxially deposited. (Epitaxial growth in the context of this invention is defined as there being no more than three discrete crystallographic orientations of one layer with respect to the adjoining material upon which it is deposited.) Generally grain boundaries, crystal defects, and interface defects between the layers resulting from non-epitaxial growth are undesirable. For example, non-epitaxial growth leads to high angle grain boundaries in materials such as $PbZr_{0.52}Ti_{0.48}O_3$, which in turn, result in device degradation through aging and fatigue induced by charge segregation and decay at the grain boundaries. Similarly, lack of epitaxial growth in the deposition of copper oxide based superconductor materials leads to significantly decreased critical current densities and degraded device properties. Interfaces between conductive layers and active layers should also be free of objectionable defects and exhibit coherent crystal structure. The presence of contamination or incoherency at an interface with, for example, copper oxide based superconductors leads to high interfacial resistance and an additional insulating interfacial region. Interfacial problems in ferroelectric devices often lead to degraded performance characteristics.

Thus, it is quite desirable to have an isotropically conductive oxide material that 1) grows epitaxially on substrates and/or other oxides, 2) allows epitaxial growth of other oxides deposited upon it, and 3) does not adversely undergo chemical reactions with these other oxides. Conductive oxide materials proposed for device applications include $Sr_2RuO_4$ Lichtenberg, F., et al., *Applied Physics Letters*, 60, 1138 (1992), $PrBa_2Cu_3O_7$, and isotropic perovskites such as Nb-doped $SrTiO_3$. However, the first has never been grown as a film, and is a layered, highly anistropic material; the second is semiconductive and anistropic; and the third is also extremely difficult to grow reproducibly while being incompatible with oxidizing conditions used to form oxides such as $YBa_2Cu_3O_7$. Therefore, an improved oxide having isotropic electrical characteristics is still not available.

SUMMARY OF THE INVENTION

Isotropically conducting thin films of $Sr_{1-x}Ca_xRuO_3$ where $0 \leq x \leq 1$ grow epitaxially on a variety of substrates and allow overlying epitaxial growth of other oxides such as PZT and oxide superconducting materials, e.g. superconducting copper oxides such as $YBa_2Cu_3O_7$. $Sr_{1-x}Ca_xRuO_3$ does not chemically react with such oxide materials and is compatible with oxide growth and processing. Relatively low isotropic resistivities, i.e. resistivities less than 400 $\mu\Omega$-cm at room temperature and 200 $\mu\Omega$-cm at 77K, have been obtained with excellent crystalline quality, good thermal and chemical stability, and good surface smoothness.

Because the lattice parameters and magnetic properties of $Sr_{1-x}Ca_xRuO_3$ are adjustable by changing the strontium to calcium ratio, $Sr_{1-x}Ca_xRuO_3$ is adaptable for a variety of uses with a wide variety of oxide materials. Conventional deposition procedures such as 90° off-axis sputtering (Eom, C. B. et al., *Applied Physics Letters*, 55, 595 (1989), and Eom, C. B., et al., *Physica C*, 171, 351 (1990)), and laser ablation are employed for depositing the $Sr_{1-x}Ca_xRuO_3$ material.

DETAILED DESCRIPTION

As discussed, epitaxial thin films of isotropically conducting oxide are useful in a variety of devices. For example, such materials are useful in optical, magnetic, opto-electric, and opto-magnetic devices, and electronic devices such as SNS junctions employing superconductive materials and non-volatile memory devices employing ferroelectric materials. Typically, device configurations for such devices are found in Scott, J. F., et al., *Science*, 246, 1400 (1989), Bondurant, D., et al., *IEEE Spectrum*, 26, 30 (1989), and Hashimoto, T., et al., *Applied Physics Letters* 60, 1756 (1992). These devices, generally, are fabricated by sequential deposition and patterning of thin films on a mechanically stable substrate. Epitaxial deposition of a variety of materials is discussed in Matthews, *Epitaxial Growth,* Academic Press, 1975, while patterning of such materials by techniques such as ion milling is discussed in Lee, M., et al., *Applied Physics Letters,* 57, 1152 (1990). Electrical contacts to the device are also made by conventional techniques such as deposition through shadow masks that are discussed in Chin, D. K., et al., *Applied Physics Letters,* 58, 753 (1991).

In the inventive devices, epitaxial $Sr_{1-x}Ca_xRuO_3$ is employed as an isotropic, electrically conducting region such as a region used to contact and/or interconnect various active regions of the device. The $Sr_{1-x}Ca_xRuO_3$ is either deposited directly on a substrate or deposited on a thin film or series of thin films (additionally including, if desired, buffer layers to prevent interdiffusion and seed layers to promote epitaxial deposition) that have been previously deposited on such substrate. Epitaxial growth for such deposition of $Sr_{1-x}Ca_xRuO_3$ is obtained provided a few rather undemanding criteria are satisfied. In particular, the in-plane lattice mismatch between the $Sr_{1-x}Ca_xRuO_3$ and the underlying material (the material upon which the $Sr_{1-x}Ca_xRuO_3$ is deposited) should be less than 20%. Lattice mismatch is equal to $[(a_0/a_{0\,(substrate)})-1]$ where $a_0$ and $a_{0\,(substrate)}$ are respectively the in-plane lattice parameters of the deposited thin film and the material upon which this thin film is deposited. Secondly, the interface between the two materials should be chemically stable at the deposition temperature. Exemplary growth substrates include MgO, $SrTiO_3$, $NdGaO_3$, $LaAlO_3$, and yttria stabilized zirconia (YSZ).

Figure 1:
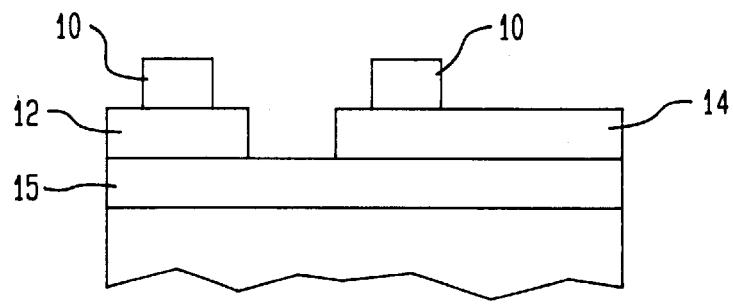
FIG. 1 is illustrative of device configurations involved in the invention.
Figure 2:
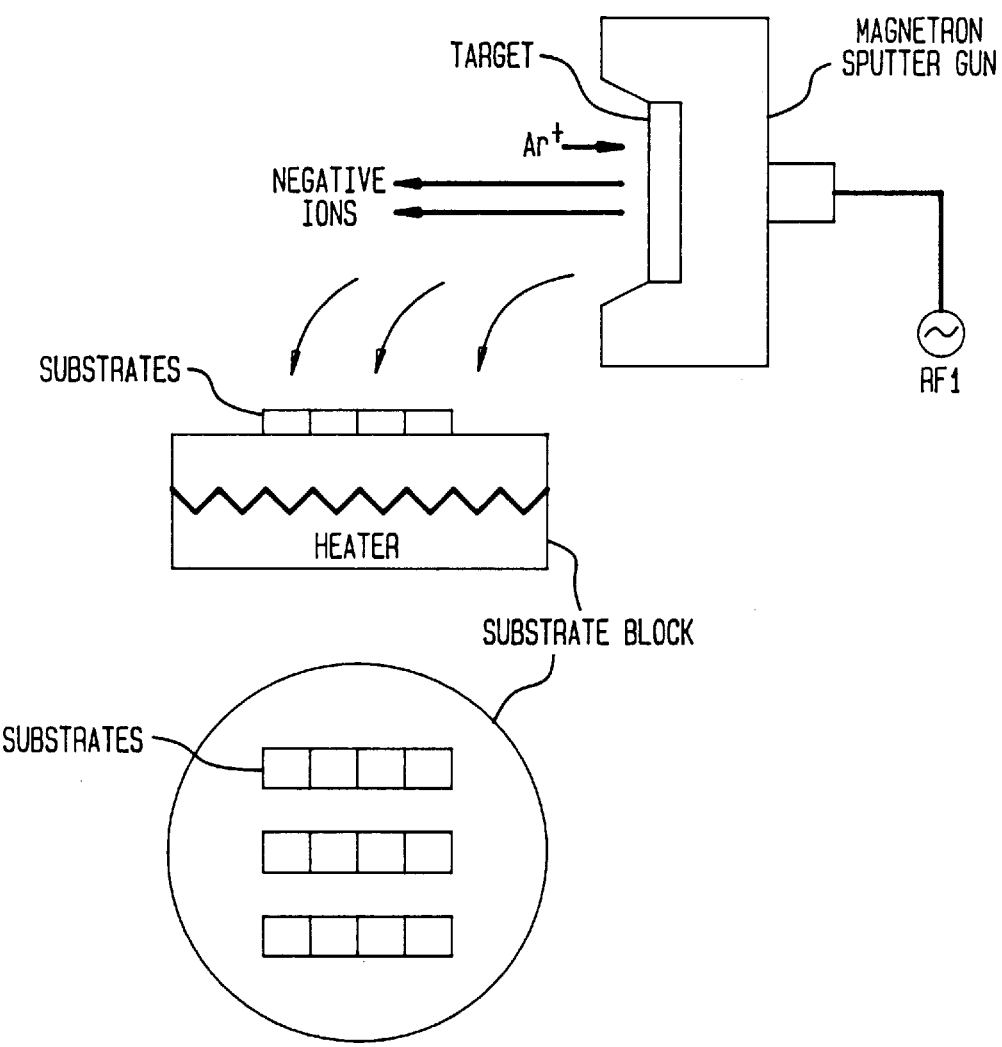
FIG. 2 is illustrative of an apparatus suitable for deposition involved in the invention.

A variety of techniques are available for depositing $Sr_{1-x}Ca_xRuO_3$. In one advantageous embodiment, 90° off-axis sputtering is utilized. This procedure is generally described in publications such as Eom, C. B., et al., *Applied Physics Letters,* 55, 595 (1989) and Eom, C. B., et al., *Physica C,* 171, 351 (1990). Briefly, the sputtering target is positioned as shown in FIG. 2, 90° off-axis from the substrate upon which deposition is desired. Argon ions accelerated at a potential generally in the range of 50–500 electron volts are impacted on the target and induce the desired sputtering. The target is formed from the materials (other than oxygen) that are to constitute the deposited layer in essentially the same ratio as dictated by the stoichiometry of the material to be deposited. Thus, for example, in a target for $S_{1-x}Ca_xRuO_3$ the ratio of strontium to calcium to ruthenium should be 1−x:x:1.

The oxygen for deposition is provided by performing the sputtering in an inert gas/oxygen environment. Typically, partial pressures of oxygen in the range of $10^{-5}$ to 300 mTorr are employed. Oxygen partial pressures less than $10^{-5}$ lead to decomposition to multiple phases, while oxygen partial pressures greater than 300 mTorr cause significantly decreased deposition rate. Inert ions such as argon ions are produced by striking a plasma in the inert gas/oxygen atmosphere. The inert gas, e.g. argon is generally present at a partial pressure of 20 to 400 mTorr. Argon pressures less than 20 mTorr lead to back sputtering, while argon pressures greater than 400 mTor result in a slow deposition rate. Typically, the plasma is struck using rf radiation at a power density exemplified by the range 50 to 150 watts on a 2" diameter target.

Alternatively, deposition of $Sr_{1-x}Ca_xRuO_3$ is possible by laser ablation. This technique is described in compendia such as *Materials Research Society Symposium Proceedings,* edited by D. C. Paine and J. C. Bravman, Vol. 191, (1990). Briefly, a target having the same composition as dictated by the stoichiometry of the deposited material (see description above) is employed. This material is ablated from the target surface using a laser such as an excimer laser emitting at 248 nm. Typically, energy densities of 0.5 to 5 $J/cm^2$ from a pulsed laser having a repetition rate in the range 1 to 50 Hz are employed. Generally, an oxygen environment having a partial pressure of $10^{-5}$ to 600 mTorr is used. Partial pressures less than $10^{-5}$ mTorr lead to unacceptable crystal structure defect densities, while a partial pressure greater than 600 mTorr, although not precluded, leads to excessively slow deposition rates.

Although the description has been in terms of a material containing strontium and/or calcium as well as ruthenium and oxygen, some chemical substitution is possible. It is possible to substitute small amounts of atoms such as rhodium and/or iridium on the ruthenium site and lanthanum on the Sr/Ca site. Generally, substitutions greater than 10 mole % are not acceptable since they lead to an undesirable change in crystal structure.

Once the $Sr_{1-x}Ca_xRuO_3$ layer is formed, it is possible to pattern it, or to deposit an overlying layer with subsequent patterning. Generally, to pattern the $Sr_{1-x}Ca_xRuO_3$ layer, standard lithographic techniques such as described in Lee, M., et al., *Applied Physics Letters,* 57, 1152 (1990), are employed. Etching is generally accomplished using ion milling. The $Sr_{1-x}Ca_xRuO_3$ is compatible with a variety of growth techniques for overlying layers. Therefore, techniques such as MBE, e-beam evaporation, MOCVD, and on-axis sputtering, from materials such as Au, Ag, Pt, Al, and other oxide material are useful for deposition on the $Sr_{1-x}Ca_xRuO_3$. The $Sr_{1-x}Ca_xRuO_3$ materials typically have a resistivity at 300° K. of between 250 and 400 $\mu\Omega$-cm. Typically, resistivities measured in three mutually perpendicular directions have a mean deviation less than 50%. The material is stable up to 900° C. and maintains excellent resistivity down to 4.2° K.

The following examples are illustrative of conditions involved in fabricating the inventive devices.

EXAMPLE 1

A miscut (100) $SrTiO_3$ substrate having its major surface oriented 2.3° from the (100) plane and having a size of ¼"×¼" was cleaned with acetone. The substrate was then placed on the sample holder of a 90° off-axis sputtering apparatus described in Eom, C. B., et al, *Applied Physics Letters,* 55, 595 (1989) and *Physica C,* 171, 351 (1990) and shown in FIG. 2. The chamber was evacuated to a pressure of $2\times10^{-6}$ Torr. A sputtering atmosphere consisting of 60 mTorr of argon and 40 mTorr of oxygen was established utilizing an argon flow rate of 12 sccm/min and an oxygen flow rate of 8 sccm/min. An rf frequency of 13.56 MHz was employed to strike a plasma in this environment. An rf power of approximately 100 Watts generated a self-bias of −140V and −220V, respectively, at the $SrRuO_3$ and $CaRuO_3$ targets. The sample holder was held at a temperature of 680° C. using a resistance heater (developed by Conductus Inc. and sold by U.S. Inc.). The resulting deposition at a rate of approximately 0.2 Å per second was continued until a film thickness of 500–2000 Å was obtained. Deposition was terminated by extinguishing the plasma. The chamber was then vented and backfilled with oxygen to a pressure of 300 Torr. The sample was allowed to cool to room temperature before removal.

The same procedure was performed on (100) $LaAlO_3$, on (110) and (001) $NdGaO_3$ (100) YSZ, and (100) MgO substrates.

Rutherford backscattering showed stoichiometric film composition and no indication of interdiffusion at the interface between the film and the substrate. Film textures were investigated by x-ray diffraction using a 4-circle diffractometer with CuK$_\alpha$ source and a pyrolitic graphite monochromer and analyzer. Resulting θ–2θ scans indicated (110) epitaxy of SrRuO$_3$ and CaRuO$_3$ films. The in-plane textures for these Eilms were also investigated by scanning off-axis peaks. The ω-scans of the (221) reflection at φ=0°, φ=45°, φ=90°, φ=180°, and φ=270° for a {110} SrRuO$_3$ thin film on (100) SrTiO$_3$ indicated that the grains are single domain with in-plane epitaxial arrangement of SrRuO$_3$ [$\overline{1}$10]//SrTiO$_3$[010] and SrRuO$_3$[001]//SrTiO$_3$[001]. The crystalline quality of the SrRuO$_3$ films was found to be indistinguishable from that of the Si single crystals by ion channeling ($\chi_{min}$=1.8%) and ω rocking curve measurement. (FWHM (220) is less than the instrument resolution of 0.16°.) Scanning electron micrograph of the surfaces showed them to be featureless with a lateral resolution of 100 Å. Atomic force microscope images on a SrRuO$_3$ film on SrTiO$_3$ substrate revealed root mean square surface roughness of 6.9±0.2 Å and peak-to-valley roughness of 53±6 Å.

Figure 3:
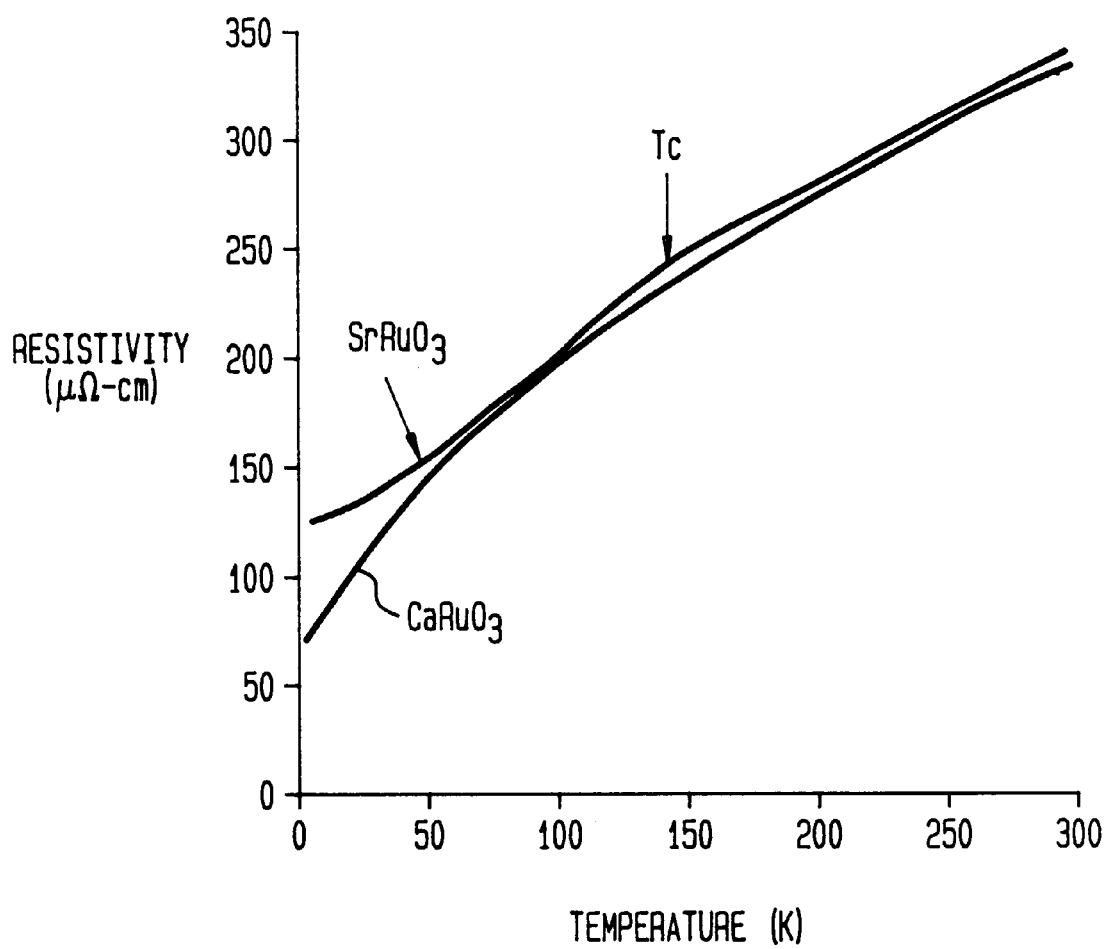
FIGS. 3–11 are illustrative of properties of deposited structures involved in the invention and structures for their measurement.

Normal state resistivities of the thin films as a function of temperature were measured by the four-terminal transport method. FIG. 3 shows resistivity vs. temperature curves for 1000 Å thick SrRuO$_3$ and CaRuO$_3$ films on (100) SrTiO$_3$. The resistivity behavior along the two orthogonal directions is the same, which is expected since these are isotropic materials. The resistivity at room temperature ($\rho_{300}$) is ~340 μΩ-cm, and the temperature dependences (dρ/dT) show good metallic behavior.

EXAMPLE 2

The procedure in Example 1 was followed except a target of YBa$_2$Cu$_3$O$_7$ and a higher substrate temperature (730° C.) was employed to produce a 2000 Å thick c-axis YBa$_2$Cu$_3$O$_7$ deposited layer on the substrates discussed in Example 1. X-ray diffraction showed only (001) peaks of YBa$_2$CU$_3$O$_7$ showing very good epitaxy of YBa$_2$Cu$_3$O$_7$ layer on those substrates. A resistivity vs. temperature curve was determined by the four point probe technique. Transition temperature at zero resistivity (T$_{co}$) was 87 K. The resistivity at room temperature ($\rho_{300K}$) was 190 μΩ-cm, the temperature dependence (dρ/dT) was 0.58 μΩ-cm/K, and zero temperature intercept (ρ(0)) was zero.

EXAMPLE 3

Figure 4:
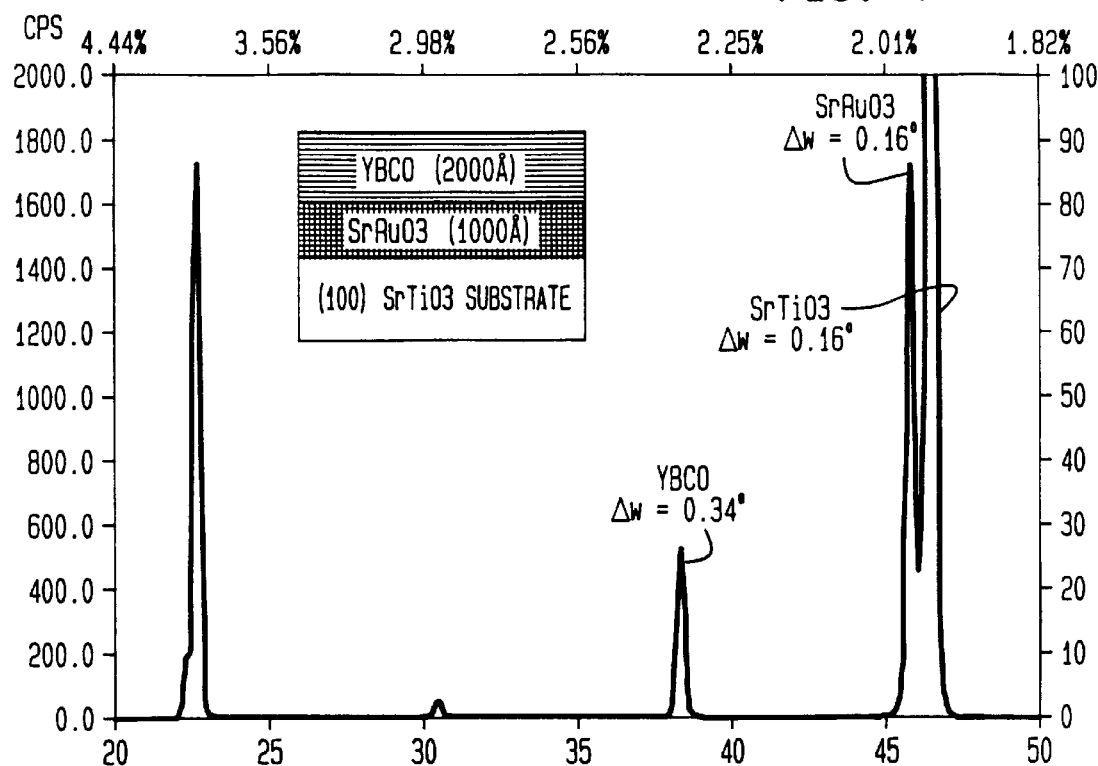

The procedure of Example 2 was followed using substrates of (100) SrTiO$_3$ having an epitaxial thin film of SrRuO$_3$ 1000 Å in thickness. The SrRuO$_3$ films was formed by the procedure described in Example 1. X-ray diffraction exhibited only (001) peaks of YBa$_2$Cu$_3$O$_7$ and (hh0) peaks of SrRuO$_3$ showing very good epitaxy of the YBa$_2$Cu$_3$O$_7$ on SrRuO$_3$ layer (see FIG. 4). The rocking curve width (FWHM) of the (005) YBa$_2$Cu$_3$O$_7$ was 0.34°. A resistivity vs. temperature curve was measured by the four point probe technique. There was no difference between the T$_c$ of this heterostructure and a 2000 Å thick single layer YBa$_2$Cu$_3$O$_7$ formed by the procedure of Example 2.

EXAMPLE 4

Figure 5:
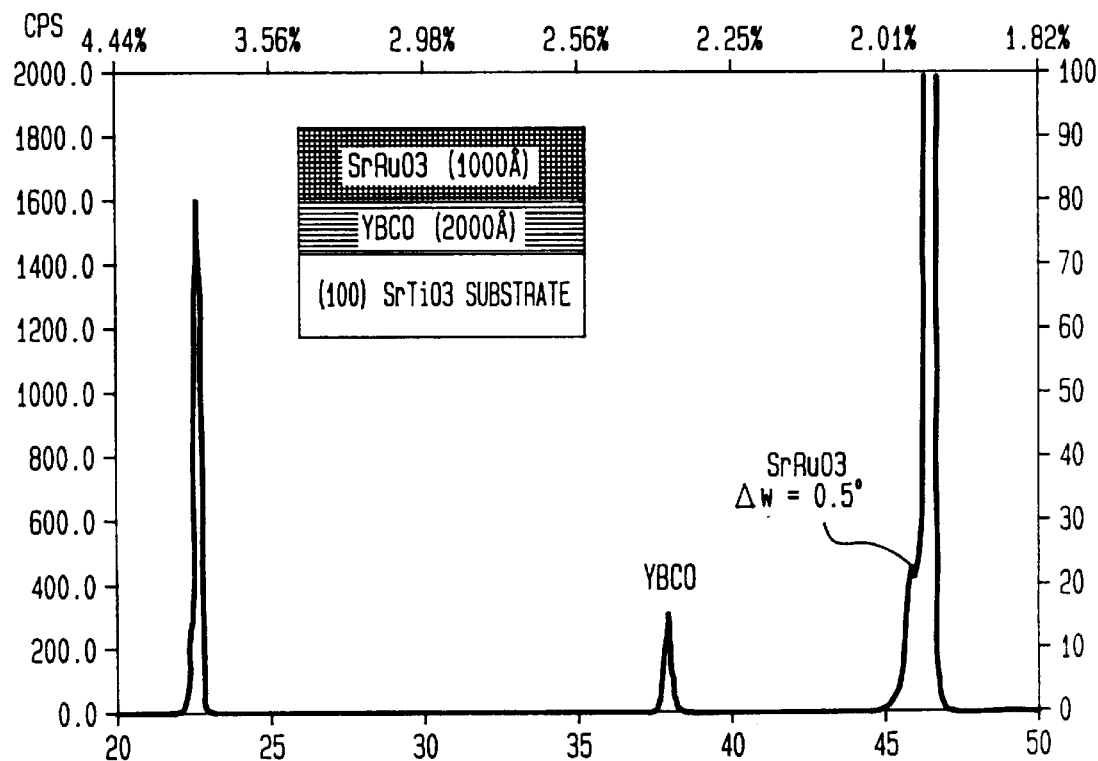

The procedure of Example 1 was followed using a substrate of (100) SrTiO$_3$ having an epitaxial thin film of c-axis YBa$_2$Cu$_3$O$_7$ 2000 Å in thickness. The YBa$_2$CU$_3$O$_7$ film was formed by the procedure described in Example 2. X-ray diffraction exhibited only (001) peaks of YBCO and (hh0) peaks of SrRuO$_3$ showing very good epitaxy of the SrRuO$_3$ on YBa$_2$Cu$_3$O$_7$ layer (see FIG. 5). The rocking curve width (FWHM) of the (220) SrRuO$_3$ was 0.5°.

EXAMPLE 5

Figure 6:
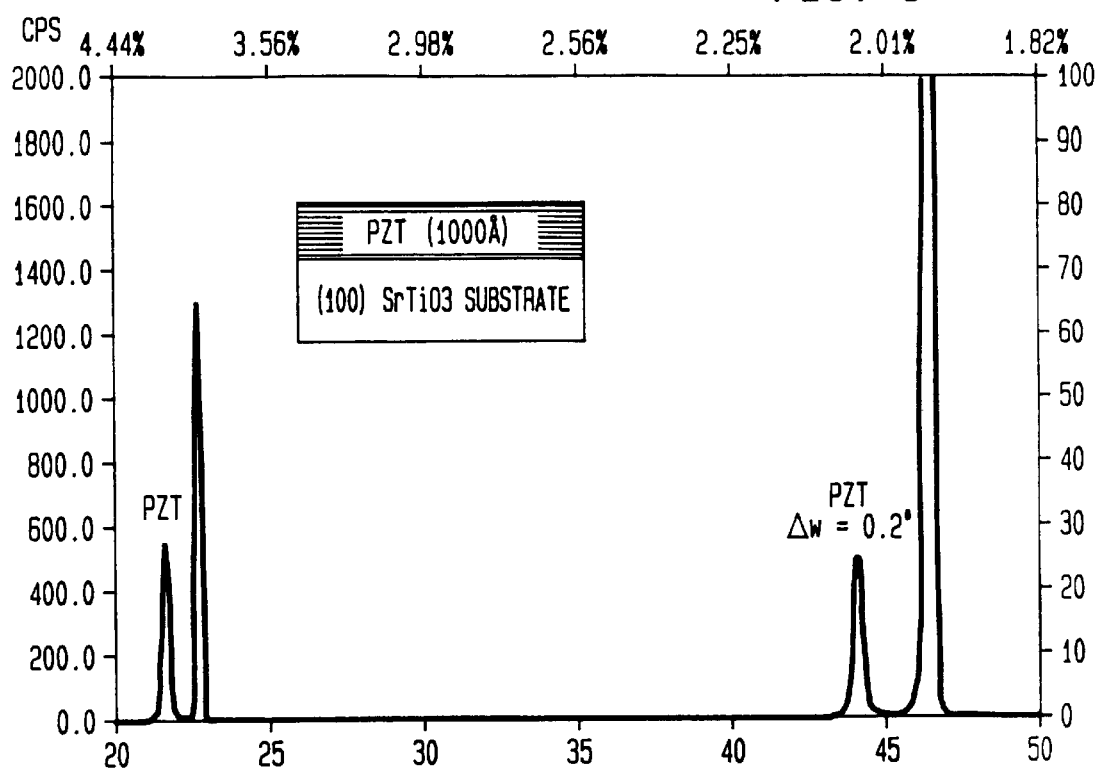

The procedure in Example 1 was followed except a target of Pb(Zr$_{0.52}$Ti$_{0.48}$)O$_3$ and a lower substrate temperature (530° C.) was employed to produce a 1000 Å thick PZT deposited layer. The x-ray diffraction showed only (001) peaks of PZT showing very good epitaxy of PZT layer on those substrates (see FIG. 6). The rocking curve width (FWHM) of the (002) PZT was 0.2°.

EXAMPLE 6

Figure 7:
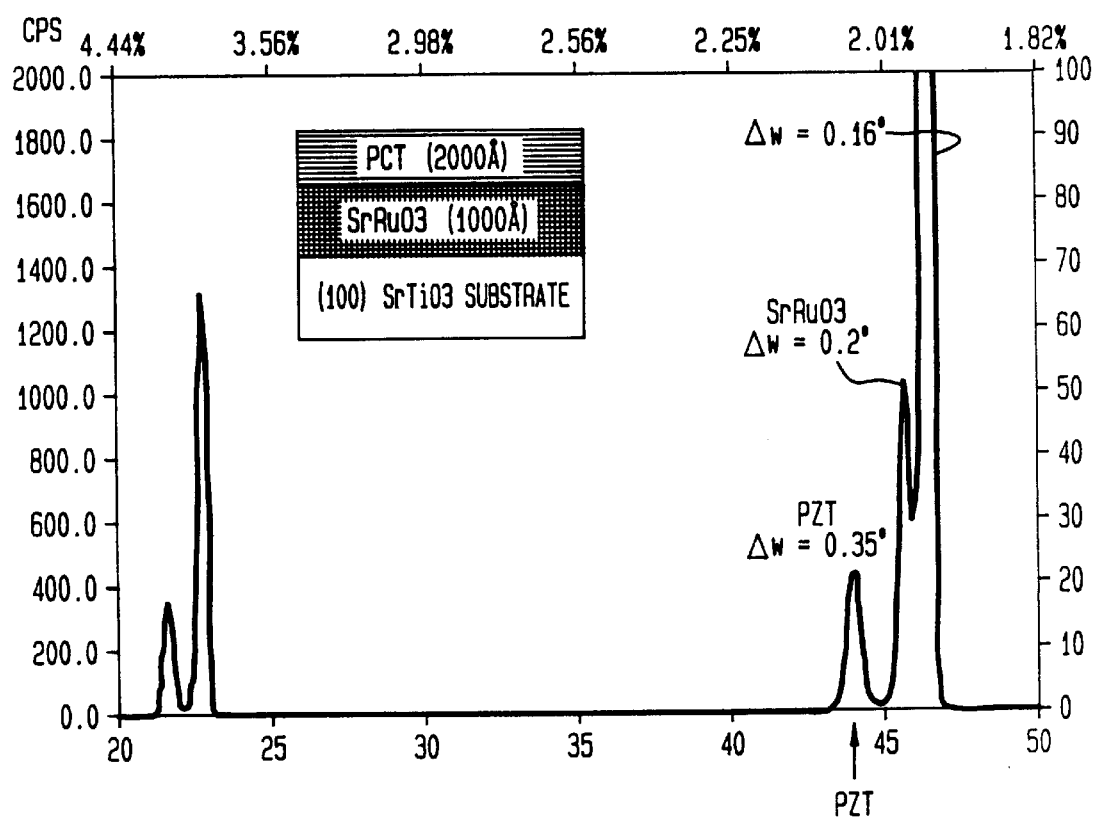

The procedure in Example 5 was followed using a substrate of (100) SrTiO$_3$ having an eptiaxial thin film of SrRuO$_3$ 1000 Å in thickness. The SrRuO$_3$ films was formed by the procedure described in Example 1. X-ray diffraction exhibited only (001) peaks of PZT and (hh0) peaks of SrRuO$_3$ showing very good epitaxy of the PZT on SrRuO$_3$ layer (see FIG. 7). The rocking curve width (FWHM) of the (002) PZT was 0.35°.

EXAMPLE 7

Figure 8:
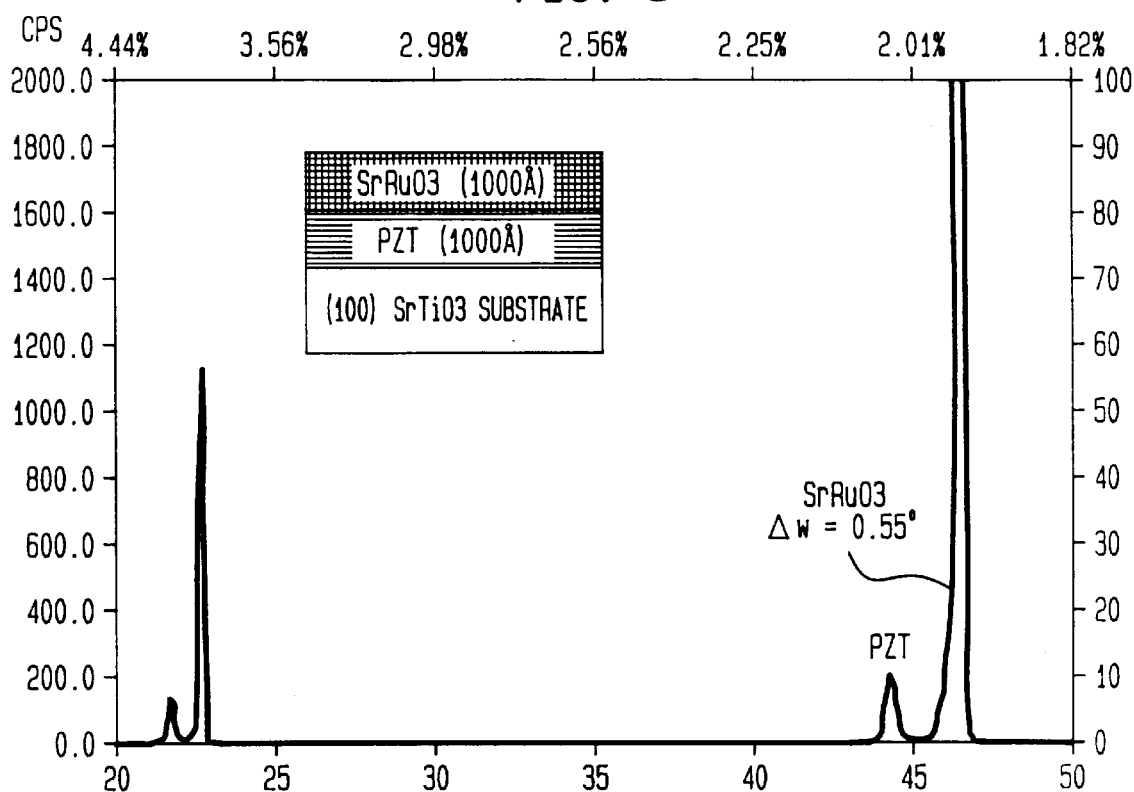

The procedure of Example 1 was followed using a substrate of (100) SrTiO$_3$ having an epitaxial thin film of PZT 1000 Å in thickness. The PZT films were formed by the procedure described in Example 3. X-ray diffraction exhibited only (001) peaks of PZT and (hh0) peaks of SrRuO$_3$ showing very good epitaxy of the SrRuO$_3$ on PZT layer (see FIG. 8). The rocking curve width (FWHM) of the (220) SrRuO$_3$ was 0.55°. A resistivity vs. temperature curve was measured by the four point probe technique. There was no difference between the resistivity behavior of the heterostructure and a 1000 Å thick single layer SrRuO$_3$ on SrTiO$_3$ substrate formed by the procedure of Example 1.

EXAMPLE 8

Figure 9:
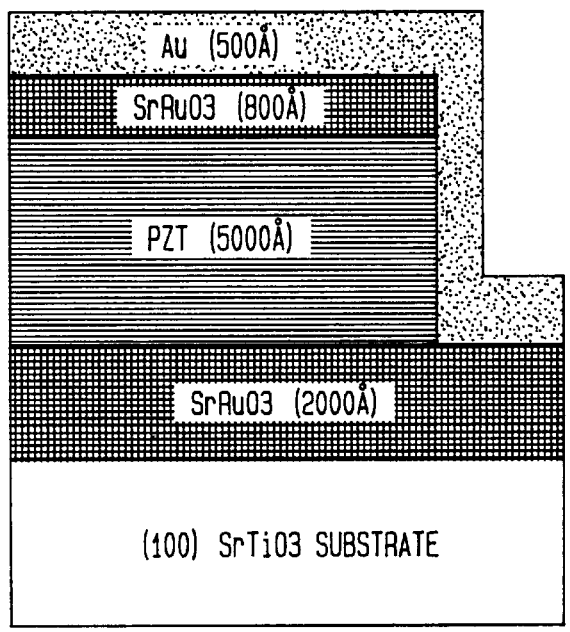
Figure 10:
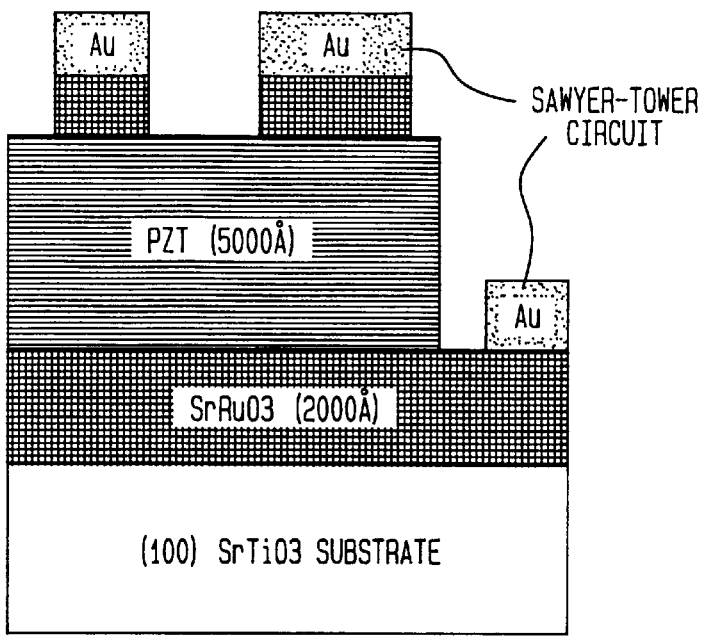

Multilayer structures were fabricated to test the ferroelectric properties of the epitaxial ferroelectric thin films between epitaxial isotropic metallic oxide layers (SrRuO$_3$) shown in FIG. 9. First, 2000 Å thick SrRuO$_3$ layers to produce a bottom electrode were deposited on (100) SrTiO$_3$ substrates by the same procedure described in Example 1. Then, a 5000 Å thick PZT layer and an 800 Å thick top SrRuO$_3$ layer were deposited under the same conditions described in Examples 5 and 1 through a 100 μm thick Si shadow mask to cover the regions of the bottom SrRuO$_3$ electrode. Finally, a 500 Å thick layer of Au was deposited by DC magnetron sputtering at room temperature to obtain a good Au wire bond between the contact pads of device and chip carrier. These Au-SrRuO$_3$-PZT-SrRuO$_3$ quatralayers were patterned using standard photolithographic processing and ion milling to form a set of 200 μm×200 μm square capacitors shown in FIG. 10.

Figure 11:
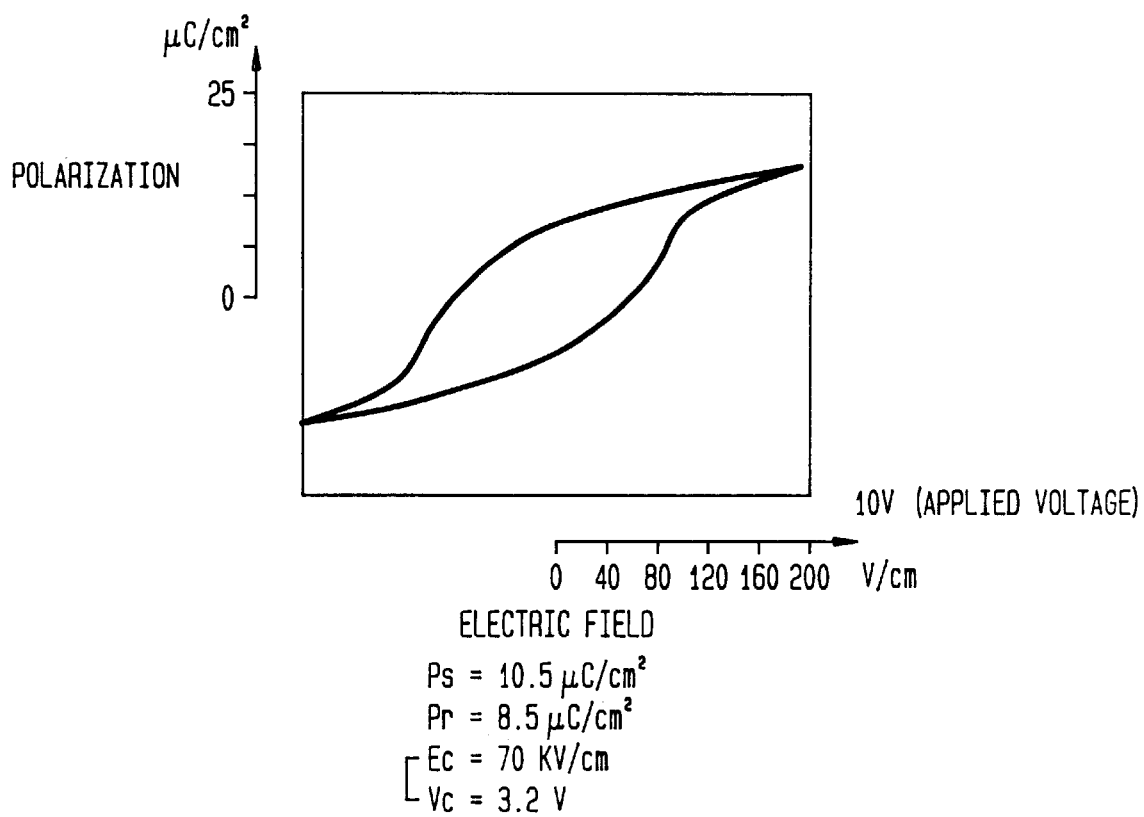

The electrical properties of the capacitors produced in Example 5 were examined by the Sawyer-Tower circuit described in *Physical Review*, 35, 269 (1930). The heterostructure exhibited ferroelectric hysteresis, as illustrated in FIG. 11. The saturation polarization obtained at 10 V was 10.5 μC/cm$^2$ while the remanence was 8.5 μC/cm$^2$. The corresponding coercive field was about 70 kV/cm. The shape of the ferroelectric hysteresis loops on the heterostructures were independent of frequency (10–100 kHz).

We claim:

1. A device comprising a substrate and a plurality of compositionally distinguishable thin film layers formed on said substrate characterized in that at least one layer of said plurality comprises an epitaxial region of $Sr_xCa_{1-x}RuO_3$ where $0 \leq x \leq 1$ wherein said region has essentially isotropic electrical conductivity, wherein the in-plane lattice mismatch between the epitaxial region of $Sr_xCa_{1-x}RuO_3$ and the underlying material is less than approximately 20%.

2. The device of claim 1 wherein x=0.

3. The device of claim 1 wherein x=1.

4. The device of claim 1 wherein at least one of said plurality comprises a ferroelectric layer.

5. The device of claim 4 wherein said ferroelectric layer is adjacent to said epitaxial region.

6. The device of claim 1 wherein at least one of said plurality comprises a superconducting oxide material.

7. The device of claim 6 wherein said superconducting oxide material is adjacent to said epitaxial region.

8. The device of claim 1 wherein said device comprises an electronic device.

* * * * *